United States Patent
Lee et al.

(10) Patent No.: US 10,188,255 B2
(45) Date of Patent: Jan. 29, 2019

(54) ROBOT CLEANER AND ROBOT CLEANER SYSTEM INCLUDING THE SAME

(71) Applicant: Samsung Electronics Co., Ltd., Suwon-si (KR)

(72) Inventors: Chang Wook Lee, Seoul (KR); Sang Hak Kim, Hwaseong-si (KR); Bo Kyung Kim, Seoul (KR); Ji Ho Seo, Suwon-si (KR); Sang Hwa Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/864,419

(22) Filed: Sep. 24, 2015

(65) Prior Publication Data

US 2016/0088755 A1  Mar. 24, 2016

(30) Foreign Application Priority Data

Sep. 24, 2014 (KR) .......................... 10-2014-0127947

(51) Int. Cl.
*A47L 11/40* (2006.01)
*B08B 13/00* (2006.01)
(Continued)

(52) U.S. Cl.
CPC ............ *A47L 11/4094* (2013.01); *A47L 9/00* (2013.01); *A47L 11/4027* (2013.01); *B08B 13/00* (2013.01); *B25J 9/08* (2013.01); *B25J 11/0035* (2013.01); *B25J 11/0085* (2013.01); *B25J 13/006* (2013.01); *H05K 7/10* (2013.01);
(Continued)

(58) Field of Classification Search
CPC ............. A47L 9/0673; A47L 2201/00; A47L 2201/06; A47L 9/00; A47L 11/4027; A47L 9/2868; B25J 9/08; B25J 11/0085
See application file for complete search history.

(56) References Cited

U.S. PATENT DOCUMENTS

2005/0015913 A1* 1/2005 Kim .......................... A47L 5/30
                                                        15/319
2005/0171636 A1* 8/2005 Tani ..................... G05D 1/0276
                                                        700/245
(Continued)

FOREIGN PATENT DOCUMENTS

| CN | 1927553 | 3/2007 |
| CN | 203779484 | 8/2014 |
| EP | 2631730 | 8/2013 |

OTHER PUBLICATIONS

Decision on Grant issued from the European Patent Office in corresponding to EP Application No. 15186635.7 dated Feb. 2, 2017.
(Continued)

*Primary Examiner* — Binh B Tran
*Assistant Examiner* — Douglas R Burtner
(74) *Attorney, Agent, or Firm* — Staas & Halsey LLP

(57) ABSTRACT

Modules with various functions may be mounted on a robot cleaner, such that the robot cleaner can perform various additional functions other than cleaning while moving. The robot cleaner cleans a floor surface while moving on the floor surface. At the robot cleaner, a module mounting unit on which at least one module capable of performing a function other than cleaning is able to be mounted is disposed.

26 Claims, 14 Drawing Sheets

(51) Int. Cl.
- *H05K 7/10* (2006.01)
- *H05K 7/14* (2006.01)
- *B25J 9/08* (2006.01)
- *B25J 11/00* (2006.01)
- *B25J 13/00* (2006.01)
- *A47L 9/00* (2006.01)

(52) U.S. Cl.
CPC ............ *H05K 7/14* (2013.01); *A47L 2201/00* (2013.01); *A47L 2201/06* (2013.01); *Y10S 901/01* (2013.01)

(56) References Cited

U.S. PATENT DOCUMENTS

| | | | |
|---|---|---|---|
| 2006/0186561 A1* | 8/2006 | Song | A47L 7/04 261/26 |
| 2006/0190146 A1 | 8/2006 | Morse et al. | |
| 2006/0200281 A1 | 9/2006 | Ziegler et al. | |
| 2007/0016328 A1* | 1/2007 | Ziegler | A47L 5/14 700/245 |
| 2008/0133052 A1* | 6/2008 | Jones | B25J 5/007 700/245 |
| 2009/0271940 A1* | 11/2009 | Lee | A47L 9/009 15/319 |
| 2012/0189507 A1* | 7/2012 | Ko | A47L 5/225 422/291 |
| 2013/0232717 A1* | 9/2013 | Lee | G05D 1/0255 15/319 |
| 2014/0121881 A1* | 5/2014 | Diazdelcastillo | A01D 42/00 701/23 |
| 2014/0130289 A1* | 5/2014 | Hyun | A47L 11/145 15/319 |
| 2015/0182089 A1* | 7/2015 | Jeong | A47L 11/28 15/98 |
| 2015/0375395 A1* | 12/2015 | Kwon | A47L 9/2857 700/245 |
| 2016/0150934 A1* | 6/2016 | Kim | A47L 11/20 15/300.1 |

OTHER PUBLICATIONS

Communication with Extended European Search Report dated Feb. 10, 2016 orresponding to EP Application No. 15186635.7.
Chinese First Office Action for Appln No. 201510617009.1 dated Jun. 28, 2017.
Chinese Second Office Action for Appln No. 201510617009.1 dated Mar. 12, 2018.
Chinese Patent Office Action issued in Chinese Patent Application No. 201510617009.1 dated Jun. 29, 2018 (12 total number of pages).
Chinese Patent Office Action, Notification of Registration and Granting of Patent Right To Invention, dated Nov. 1, 2018 in Chinese Patent Application No. 201510617009.1 (Total of 6 pages).

* cited by examiner

ROBOT CLEANER AND ROBOT CLEANER SYSTEM INCLUDING THE SAME

RELATED APPLICATION(S)

This application claims the benefit of Korean Patent Application No. 2014-0127947, filed on Sep. 24, 2014 in the Korean Intellectual Property Office, the disclosure of which is incorporated herein by reference.

BACKGROUND

The present disclosure relates to a robot cleaner capable of having a module with various functions mounted thereon, and a robot cleaner system including the same.

A robot cleaner is an apparatus that performs a cleaning task by sucking foreign substances such as dust from a floor surface while autonomously moving on an area to be cleaned without being manipulated by a user. A robot cleaner determines a distance to an obstacle such as a piece of furniture, an office supply, and a wall placed within an area to be cleaned using a distance sensor and selectively drives a left wheel motor and a right wheel motor of the robot cleaner to clean the area to be cleaned while switching a direction thereof by itself.

A main body of a robot cleaner includes wheels configured to drive the robot cleaner. In case of the wheels, two wheels may respectively be disposed at left and right edges of a central region of a lower portion of the main body to be symmetrical to each other. At the lower portion of the main body, a castor capable of moving in all directions may be further included. The main body can maintain a stable posture due to the castor.

A main body may include a suction motor configured to generate a suction force, and a dust collector in which the foreign substances separated from sucked-in air is collected. A suction hole through which air is sucked in may be provided at the main body, and a brush unit may be rotatably disposed at a side of the suction hole to pick up a foreign substance on a floor surface and guide the foreign substance toward the suction hole.

A robot cleaner includes a power unit for driving the main body. The power unit includes a main body, and a battery that is electrically connected to each of driving devices for driving various types of parts connected to the main body to supply driving power to each of the driving devices. The battery may be provided as a secondary battery that is rechargeable. When the robot cleaner completes a cleaning process, or the battery needs to be charged during the cleaning process, the robot cleaner may move to a docking station. The robot cleaner couples to the docking station and is supplied with electricity from the docking station to charge the battery.

SUMMARY

According to an embodiment of the present disclosure, a robot cleaner system capable of performing various functions other than cleaning can be provided. A connector that can recognize at least one module capable of performing various functions is included in a robot cleaner.

The robot cleaner according to an embodiment of the present disclosure is a robot cleaner that cleans a floor surface while moving on the floor surface. The robot cleaner includes a module mounting unit on which at least one module capable of performing a function other than cleaning is able to be mounted.

The module may be at least one of an air purification module, a humidifier module, a dehumidifier module, a bug repellence module, a speaker module, a lighting module, and a sleep induction module.

The robot cleaner may include a plurality of ports, and the module may include a connection unit connected to at least one of the plurality of ports.

A function of the module may be recognized in accordance with positions or a number of the positions in which the connection unit is connected to at least one of the plurality of ports.

When the module is mounted on the module mounting unit, a control unit may recognize the module and control the module to perform the function.

The at least one of the plurality of ports may provide a driving force to the module.

At the module mounting unit, an opening may be formed and provided at one side of a housing forming an exterior of the robot cleaner.

At the module mounting unit, fixing devices configured to fix the module inserted into the module mounting unit may be included.

The fixing devices may include frames formed to correspond to the shape of the opening.

At least one fixing unit may be provided at the frames, and the module may be fixed by the at least one fixing unit when the module is inserted into an inner portion of the frame.

The at least one fixing unit may fix the module by hooking.

The fixing devices may include a first fixing device including a rectangular frame, and a second fixing device including a circular frame.

The second fixing device may be able to be inserted into the first fixing device and fixed.

The at least one fixing unit may be provided at the first fixing device, and an interference unit capable of interfering with the at least one fixing unit may be provided at the second fixing device.

A rectangular parallelepiped module may be inserted into the first fixing device and fixed, and a cylindrical module may be inserted into the second fixing device and fixed.

According to an embodiment of the present disclosure, a robot cleaner system includes: a robot cleaner configured to clean a floor surface while moving on the floor surface, and having a module mounting unit on which at least one module capable of performing a function other than cleaning is able to be mounted; and a remote controller provided to remotely control the robot cleaner.

The remote controller may transmit a signal related to a position of the remote controller, and the robot cleaner may receive the signal, such that the robot cleaner moves in accordance with a signal generated from the remote controller.

The robot cleaner may be Bluetooth-paired to the remote controller.

The robot cleaner may move in accordance with the remote controller by a radar transceiver module.

The module may be at least one of an air purification module, a humidifier module, a dehumidifier module, a bug repellence module, a speaker module, a lighting module, and a sleep induction module.

When the at least one module is mounted on the module mounting unit, a connection unit included in the module may be connected to at least one of a plurality of ports provided at the module mounting unit, a driving force may be transmitted to the at least one module, and the function of the at least one module may be executed.

When a speaker module is mounted on the robot cleaner, the robot cleaner may perform a preset dance move.

The preset dance move may be formed of a combination of rotating, and rapidly reciprocating in front and rear directions and in left and right directions.

At the module mounting unit, an opening may be formed and provided at one side of a housing forming an exterior of the robot cleaner.

At the module mounting unit, fixing devices configured to fix the at least one module inserted into the opening may be included.

The fixing devices may include a first fixing device capable of fixing a rectangular parallelepiped module, and a second fixing device capable of fixing a cylindrical module.

The second fixing device may be detachably disposed at the first fixing device.

According to an embodiment of the present disclosure, a robot cleaner system includes: a robot cleaner configured to clean a floor surface while moving on the floor surface, and having the module mounting unit on which at least one module capable of performing a function other than cleaning is able to be mounted; and a remote controller provided to remotely control the robot cleaner, a plurality of ports are provided at the module mounting unit, and a connection unit connected to at least one of the plurality of ports is disposed at the at least one module mounted on the module mounting unit, such that when the connection unit is connected to at least one of the plurality of ports, the at least one module is recognized, and a driving force is supplied to the at least one module to execute a function of the at least one module.

A movement of the robot cleaner and the function of the at least one module may be controlled by the remote controller.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Hereinafter, a robot cleaner system according to an embodiment of the present disclosure will be described in detail with reference to the accompanying drawings.

Figure 1:
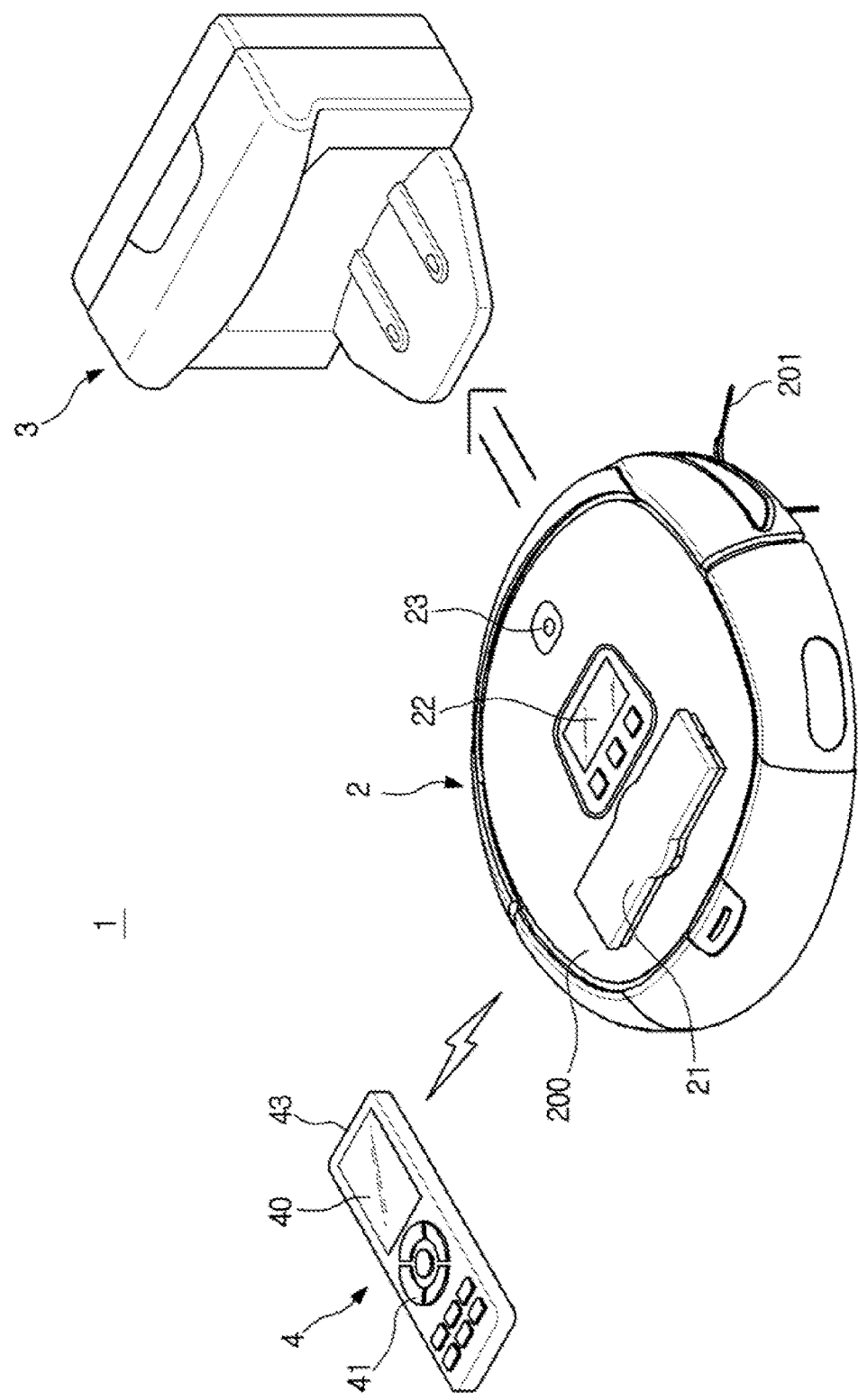
FIG. 1 is a perspective view illustrating a robot cleaner system according to an embodiment of the present disclosure.

FIG. 1 is a perspective view illustrating a robot cleaner system according to an embodiment of the present disclosure.

Referring to FIG. 1, a robot cleaner system 1 according to an embodiment of the present disclosure includes a robot cleaner 2 that is capable of moving. The robot cleaner 2 includes a battery (not shown) that supplies driving power to drive various types of parts disposed inside the robot cleaner 2.

The robot cleaner 2 may include a wheel assembly (not shown). By the wheel assembly, the robot cleaner 2 can perform locomotive motions such as moving forward, moving backward, rotating, and the like. The wheel assembly may include two wheels (not shown) respectively disposed at left and right edges of a central region of a lower portion of the robot cleaner 2 to be symmetrical to each other.

With respect to a direction in which the robot cleaner 2 is moving, a castor (not shown) capable of moving in all directions may be installed at a front portion or a rear portion of the lower portion of the robot cleaner 2. The robot cleaner 2 can maintain a stable posture due to the two wheels and the castor.

The robot cleaner 2 may include a brush unit (not shown). The brush unit may include a main brush unit (not shown) and auxiliary brush units 201. The main brush unit can be rotatably disposed at a side of a suction hole (not shown) of the robot cleaner 2. The main brush unit may include a roller (not shown) rotatably mounted at the side of the suction hole of the robot cleaner 2, and a brush (not shown) disposed at an outer circumferential surface of the roller.

The auxiliary brush units 201 may be included to widen an area to be cleaned by the robot cleaner 2. The auxiliary brush units 201 may be rotatably installed at both left and right sides of the main brush unit. The auxiliary brush units 201 may brush a foreign substance on a floor surface, on which the robot cleaner 2 is moving, toward the suction hole.

The robot cleaner 2 includes a module mounting unit 20 (see FIG. 2) on which various modules can be mounted. Various modules capable of performing a specific function can be mounted on the module mounting unit 20. When a module is not mounted on the module mounting unit 20, the module mounting unit 20 can be covered by a module cover 21. The module cover 21 and a housing 200 are connected by a hinge (not shown), such that the module cover 21 can be disposed to be rotatably opened/closed about the hinge. The module cover 21 can be detached from the housing 200. The module mounting unit 20 and the various modules performing a specific function mounted on the module mounting unit 20 will be described later.

A display unit 22 may be disposed at one side of the robot cleaner 2. Various types of states of the robot cleaner 2 may be displayed on the display unit 22. For example, states such as, for example, a battery charge state, whether a dust collector is full of dust, whether the robot cleaner 2 is in a cleaning mode, a dormant mode, or is performing a function by a mounted module, and so on, of the robot cleaner 2 may be displayed.

Although not shown, various types of sensors may be mounted on or in the robot cleaner 2. The sensors may include a proximity sensor or a vision sensor. When the robot cleaner 2 is configured to move in a random direction without a predetermined path, i.e. in a cleaning system without a map, the robot cleaner 2 can move on an area to be cleaned using a proximity sensor. When the robot cleaner 2 is configured to move along a predetermined path, i.e. in a cleaning system that requires a map, a map can be generated after receiving position information of the robot cleaner 2 by a vision sensor.

The robot cleaner 2 can remotely be controlled by a remote controller 4. The robot cleaner 2 may include a sensor 23, for example, an infrared (IR) sensor, capable of receiving a signal from the remote controller 4. The remote controller 4 may be a remote control, a mobile phone, and the like. The remote controller 4 includes a transmission unit 43 configured to transmit an IR signal. A display unit 40 is disposed at the remote controller 4 to display various types of states of the robot cleaner 2 thereon. A manipulation unit 41 can be disposed at the remote controller 4. By manipulating the manipulation unit 41, a user can control the robot cleaner 2 to move, or perform cleaning or other functions corresponding to various types of modules.

The robot cleaner system 1 may include a docking station 3. When the robot cleaner 2 has completed cleaning, or the battery of the robot cleaner 2 require charging, the robot cleaner 2 may move toward the docking station 3. When the robot cleaner 2 couples to the docking station 3, the battery can be charged by being supplied with electricity from the docking station 3.

Figure 2:
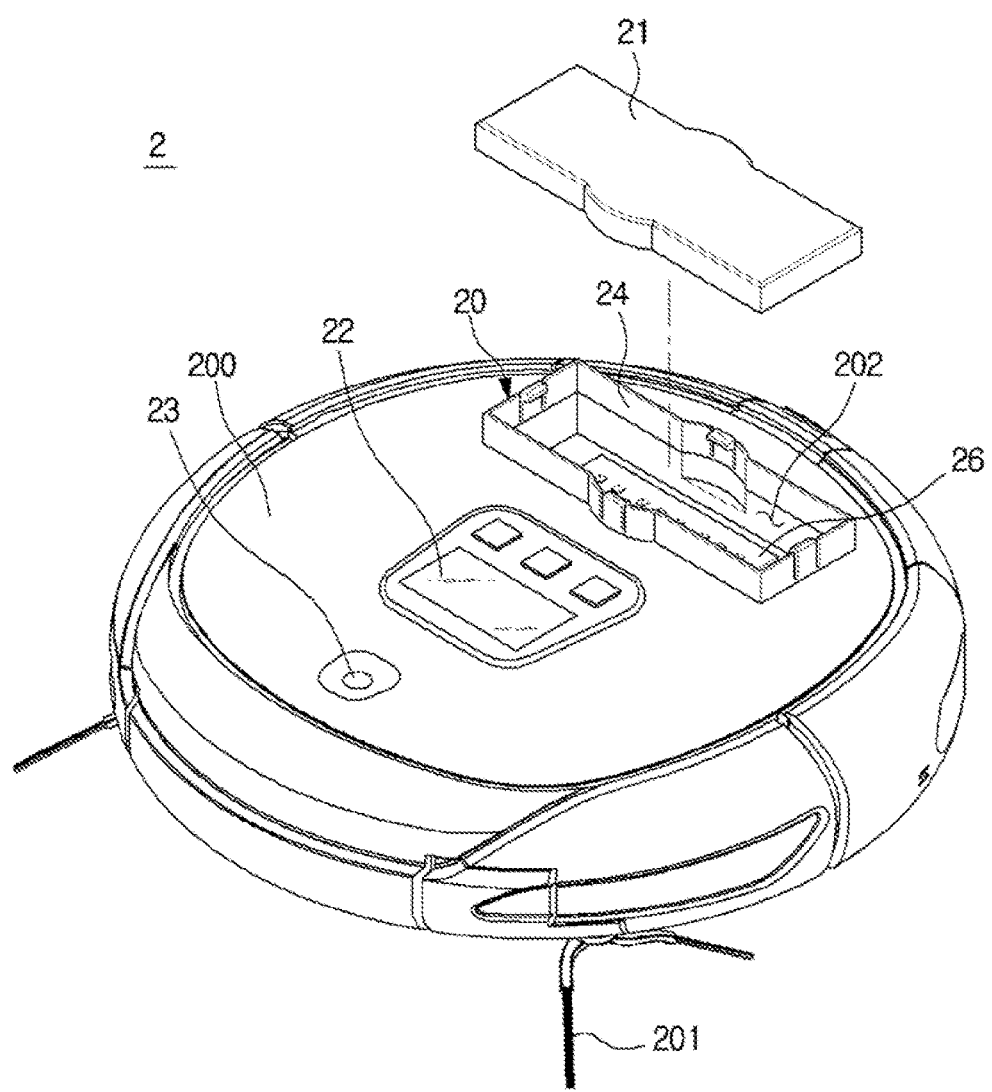
FIG. 2 is a view illustrating an appearance of a robot cleaner from which a module cover is removed according to an embodiment of the present disclosure.
Figure 3:
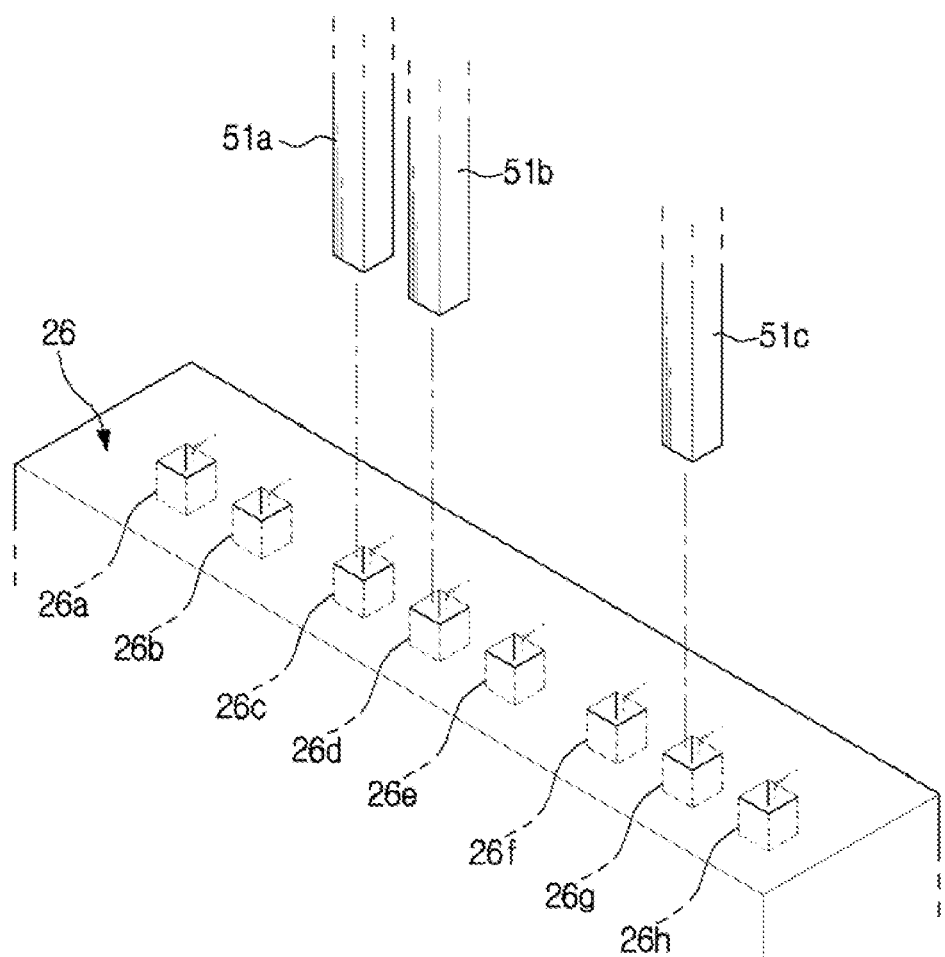
FIG. 3 is a view illustrating an example of a connector of a robot cleaner according to an embodiment of the present disclosure.

FIG. 2 is a view illustrating an appearance of a robot cleaner from which the module cover 21 is removed according to an embodiment of the present disclosure, and FIG. 3 is a view illustrating an example of a connector of a robot cleaner according to an embodiment of the present disclosure.

Referring to FIGS. 2 and 3, the module mounting unit 20 may be provided at the robot cleaner 2 according to an embodiment of the present disclosure. An opening 202 may be formed at one side of the housing 200 of the robot cleaner 2, and modules (M) (see FIGS. 5 and 6) with various functions may be mounted through or inserted into the opening 202. For example, the modules (M) may be an air purification module, a bug repellence module, a speaker module, a lighting module, or a sleep induction module. The types of the modules (M) are not limited thereto.

When any one of the various modules (M) with various functions is mounted on the module mounting unit 20, the robot cleaner 2 has to recognize a type of the mounted module (M) and perform operation control in accordance with the function of the corresponding recognized module (M). A connector 26 is disposed at the module mounting unit 20, so that the function of the module (M) mounted on the module mounting unit 20 can be recognized.

The connector 26 disposed at the side of the module mounting unit 20 may include a plurality of ports 26a to 26h. At one side of the module (M) mounted on the module mounting unit 20, at least one of connection units 51a to 51c connected to at least one of the plurality of ports 26a to 26h may be disposed. When the module (M) is mounted on the module mounting unit 20, at least one of the connection units 51a to 51c disposed at the module (M) may be inserted into and electrically connected to at least one of the plurality of ports 26a to 26h disposed at the connector 26.

The positions and number of the ports of the plurality of ports 26a to 26h to which the connection units 51a to 51c are connected may vary in accordance with the type of the module (M). A control unit 270 disposed at the robot cleaner 2 is capable of detecting the function of the mounted module (M) in accordance with the positions and number of the ports of the plurality of ports 26a to 26h to which the connection units 51a to 51c are connected, and executing a specific function of the mounted module (M).

At least one of the plurality of ports 26a to 26h may be a power port that is supplied with electricity from a driving source disposed in the robot cleaner 2. The electricity charged in the battery disposed in the robot cleaner 2 can be provided to the mounted module (M) through the power port. The battery that supplies electricity to the module (M) may be the same as the battery that supplies electricity when the robot cleaner 2 performs cleaning or moves. The battery that supplies electricity to the module (M) may also be separately provided from the battery that supplies electricity when the robot cleaner 2 performs cleaning or moves. The power port may be a port that is separately provided from the plurality of ports 26a to 26h disposed at the connector 26.

For example, the module (M) with a specific function may include a first connection unit 51a, a second connection unit 51b, and a third connection unit 51c. The first connection unit 51a may be connected to the third port 26c disposed at the connector 26, the second connection unit 51b may be connected to the fourth port 26d, and the third connection unit 51c may be connected to the seventh port 26g. At least one of the third port 26c, the fourth port 26d, and the seventh port 26g may be the power port. For example, the third port 26c may be the power port. The first connection unit 51a may be supplied with electricity by being connected to the third port 26c, and supply electricity to the module (M). The second connection unit 51b and the third connection unit 51c may respectively be connected to the fourth port 26d and the seventh port 26g, such that the module (M) can be recognized as a module (M) performing a specific function and be controlled to perform the specific function. For example, the module (M) may be recognized as an air purification module with an air purification function and be controlled to perform air purification.

Even if the number of connection units 51a, 51b, 51c, disposed at a module (M) is the same as above, the module (M) may be recognized as a module (M) performing a different function if positions in which the connection units are connected to the ports among the ports 26a to 26h disposed at the connector 26 are different from the above. For example, even if the module (M) includes three connection units 51a to 51c, the module (M) may be recognized as a module (M) that performs a different function from the air purification module if one of the connection units 51a to 51c is connected to the third port 26c, which is a power port, and the other two of the connection units 51a to 51c are respectively connected to the first port 26a and the fifth port 26*e*. For example, the module (M) mounted on the module mounting unit 20 may be recognized as a lighting module and the operation thereof may be controlled.

Even if the first connection unit 51*a* disposed at the module (M) is connected to the third port 26*c* disposed at the connector 26, the second connection unit 51*b* is connected to the fourth port 26*d*, and the third connection unit 51*c* is connected to the seventh port 26*g*, a module (M) may be recognized as a module (M) that performs a different function from the air purification module or the lighting module when one or more connection units are further disposed at the module (M) and connected to one or more of the ports 26*a* to 26*h* disposed at the connector 26. For example, when a fourth connection unit (not shown) is further included at the module (M) and connected to the sixth port 26*f* disposed at the connector 26, the module (M) mounted on the module mounting unit 20 may be recognized as a speaker module.

In this way, the function of a module (M) mounted on the module mounting unit 20 may be detected in accordance with the number of connection units disposed at the module (M) and to which ports among the ports 26*a* to 26*h* disposed at the connector 26 the connection units are connected. When the module (M) is mounted on the module mounting unit 20, electricity is supplied to the module (M) through the power port, and the type of the module (M) is detected, such that the module (M) can be controlled to perform its specific function.

Figure 4:
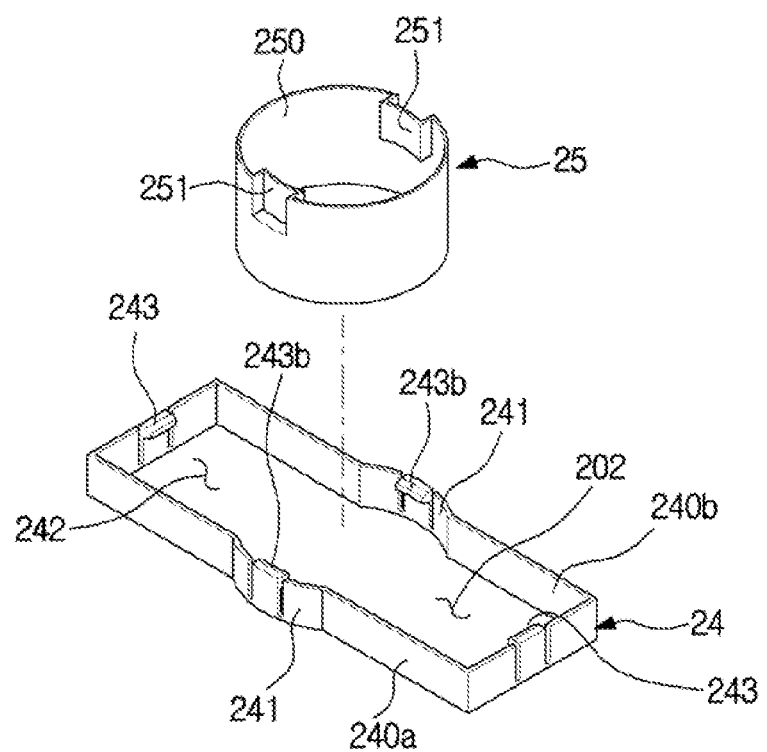
FIG. 4 is a view illustrating fixing devices of a module of a robot cleaner according to an embodiment of the present disclosure.
Figure 5:
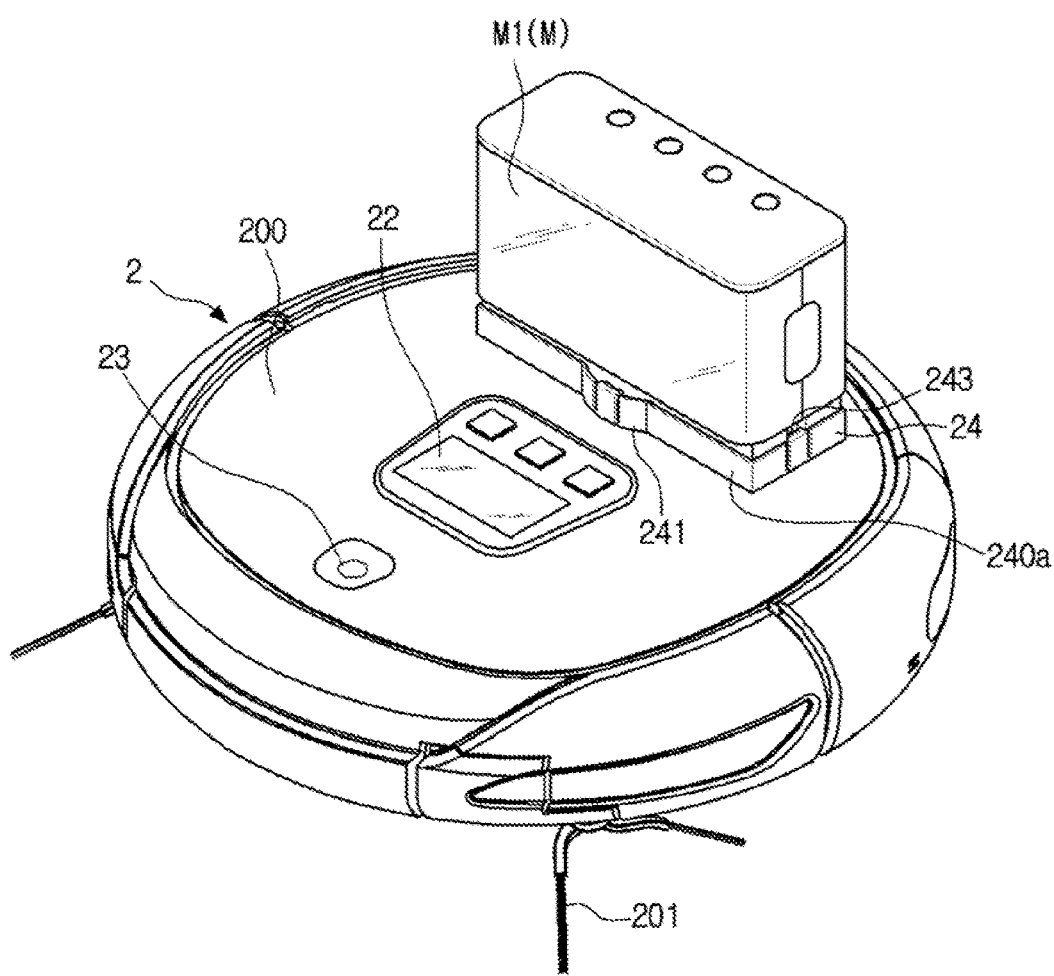
FIG. 5 is a view illustrating an appearance of a robot cleaner on which a first module is mounted according to an embodiment of the present disclosure.
Figure 6:
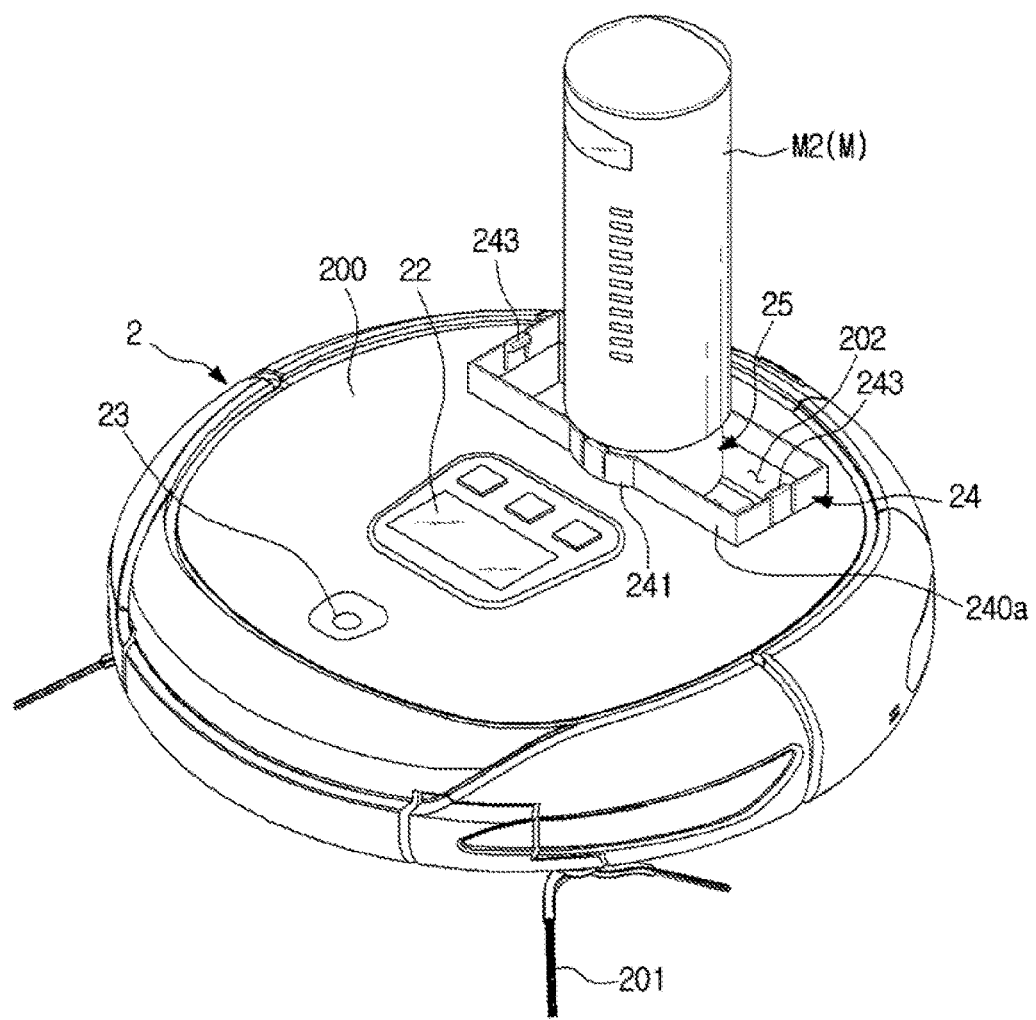
FIG. 6 is a view illustrating an appearance of a robot cleaner on which a second module is mounted according to an embodiment of the present disclosure.

FIG. 4 is a view illustrating a fixing device of a module of a robot cleaner according to an embodiment of the present disclosure. FIG. 5 is a view illustrating an appearance of a robot cleaner on which a first module is mounted according to an embodiment of the present disclosure. FIG. 6 is a view illustrating an appearance of a robot cleaner on which a second module is mounted.

Referring to FIGS. 4 through 6, fixing devices 24 and 25 may be disposed at the module mounting unit 20 of the robot cleaner 2 according to an embodiment of the present disclosure. The fixing devices 24 and 25 may fix a module (M) inserted into the module mounting unit 20.

The fixing devices 24 and 25 may include a first fixing device 24 and a second fixing device 25. To respectively fix modules (M) with different outer circumferential shapes, the first fixing device 24 and the second fixing device 25 may be provided in different inner circumferential shapes.

For example, the first fixing device 24 may be disposed to have a polygonal inner circumferential surface to fix a module (M) having a polyhedral outer circumferential surface, and the second fixing device 25 may be disposed to have a circular inner circumferential surface to fix a module (M) having a cylindrical outer circumferential surface.

Hereinafter, an embodiment in which, as shown in FIG. 5, the inner circumferential surface of the first fixing device 24 is formed in an approximately rectangular shape to fix a first module (M1) which is in a rectangular parallelepiped shape, and, as shown in FIG. 6, the inner circumferential surface of the second fixing device 25 is formed in a circular shape to fix a second module (M2) in a cylindrical shape, will be described.

The first fixing device 24 may be disposed at the opening 202 formed at one side of the housing 200. The first fixing device 24 may be provided separately from the housing 200 and coupled to one side of the opening 202, or may be integrated with the housing 200. The shape of an outer circumferential surface of the first fixing device 24 and the shape of an inner circumferential surface at the side of the opening 202 of the housing 200 may correspond to each other.

The first fixing device 24 may be in a rectangular shape to roughly correspond to the shape of the opening 202. The first fixing device 24 may include first frames 240 which are straight sections, and second frames 241 which are sections with a predetermined curvature. The rectangular parallelepiped first module (M1) as shown in FIG. 5 may be inserted into and fixed to an inner space 242 formed by the first frames 240 of the first fixing device 24.

The second frames 241 may respectively be disposed at the first frames 240*a* and 240*b* facing each other. The second frames 241 configured to face each other may be disposed to form portions of the same circle. The circular second fixing device 25 may be inserted into inner portions of the second frames 241. The second fixing device 25 can fix the cylindrical second module (M2). The second module (M2) with a cylindrical outer circumferential surface may directly be inserted into and fixed to the inner portions of the second frames 241.

At least one fixing unit 243 fixing or securing the first module (M1) inserted into the first fixing device 24 may be provided at the first fixing device 24. For example, the fixing units 243 may be provided as a hook-shaped unit to fix or secure the first module (M1) inserted into the first fixing device 24, so that the first module (M1) does not move and is not detached from the first fixing device 24 when the robot cleaner 2 moves. The fixing units 243 may be disposed at each of the first frames 240 and the second frames 241 facing each other.

The second fixing device 25 may be used to fix or secure the cylindrical second module (M2). The second fixing device 25 may be detachable from the first fixing device 24. The second fixing device 25 may be inserted into a circular space formed by the second frames 241 of the first fixing device 24. The second fixing device 25 may be inserted into the circular space formed by the second frames 241 and be fixed or secured by the fixing units 243*b*.

The second fixing device 25 may be detachably provided to be inserted into the first fixing device 24 and fixed only when the cylindrical second module (M2) is to be inserted into the module mounting unit 20. The second fixing device 25 may be inserted into the second frames 241 and fixed after being mounted on the outer circumferential surface of the cylindrical second module (M2). An interference unit 251 capable of being interfered by the fixing units 243*b* disposed at the second frames 241 of the first fixing device 24 may be provided at the second fixing device 25. A circular inner surface formed by a circular frame 250 of the second fixing device 25 may correspond to the outer circumferential surface of the cylindrical second module (M2).

The module (M) capable of performing various functions may not only be provided in a rectangular parallelepiped shape or a cylindrical shape, but also be provided in various other shapes and sizes. As an example, a speaker module, and the like, may be provided in a rectangular parallelepiped shape, and an air purification module, a lighting module, and the like may be provided in a cylindrical shape. To correspond to the various shapes and sizes of the modules (M), the fixing devices 24 and 25 may be provided in various shapes and sizes.

To perform various functions other than cleaning by the robot cleaner 2, a user may remove the module cover 21 (of FIG. 2) and mount a module (M) performing a specific function on the module mounting unit 20. When the module (M) is mounted on the module mounting unit 20, the connection units 51*a* to 51*c* of the module (M) are connected to the ports 26*a* to 26*h* of the connector 26, such that electricity is supplied to the module (M), and the type of the module (M) is detected, such that the specific function of the module (M) can be performed.

Figure 7:
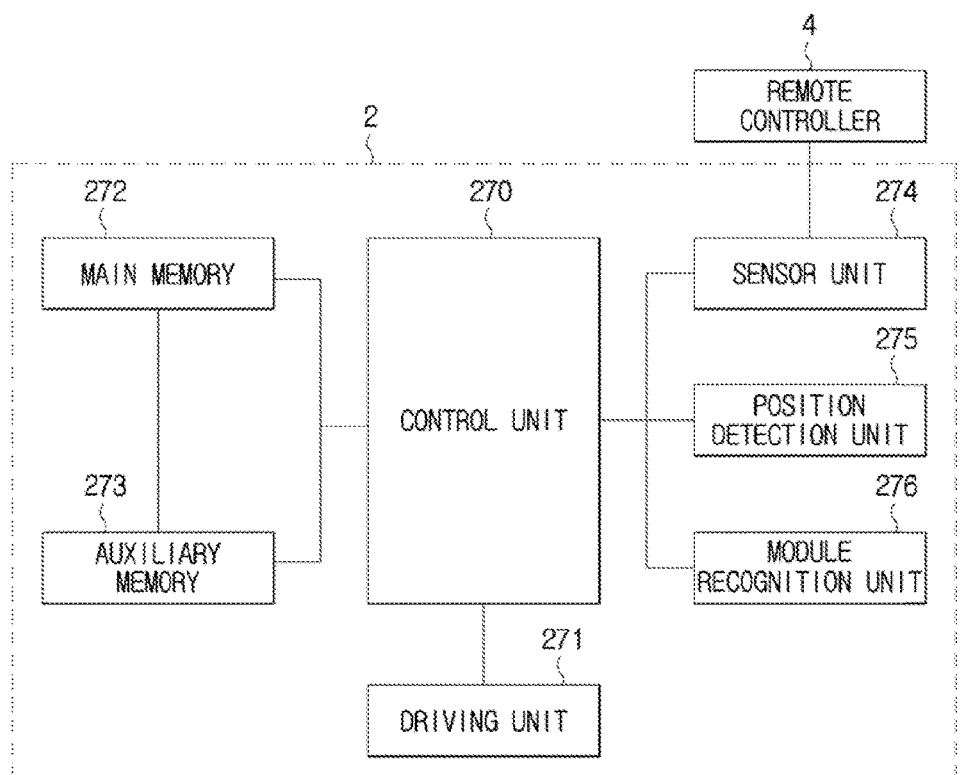
FIG. 7 is a block diagram illustrating an inner configuration of a robot cleaner according to an embodiment of the present disclosure.

FIG. 7 is a block diagram illustrating an inner configuration of a robot cleaner according to an embodiment of the present disclosure.

Referring to FIG. 7, the robot cleaner system 1 according to an embodiment of the present disclosure includes the robot cleaner 2, and the remote controller 4 capable of remotely controlling the robot cleaner 2. The remote controller 4 may be in any form if it is an apparatus that a user may use to remotely control the robot cleaner 2. The remote controller 4 may be a remote control, a mobile phone, and the like.

The robot cleaner 2 includes the control unit 270 configured to control some or all operations of the robot cleaner 2 including cleaning, moving, and operations related to a module (M) mounted on the robot cleaner 2.

The robot cleaner 2 includes a driving unit 271 to supply a driving force for cleaning, moving, and performing a specific function of the module (M). The driving unit 271 may include a battery. One driving unit 271 may provide a driving force for cleaning, moving, and performing a specific function of the module (M) of the robot cleaner 2. The driving unit 271 to supply a driving force for cleaning and moving of the robot cleaner 2 may also be separately disposed from a driving unit 271 to supply a driving force for performing of a specific function of the module (M) mounted on the robot cleaner 2.

The robot cleaner 2 may include memories 272 and 273 in which various information related to operations of the robot cleaner 2 is stored. In the embodiment shown, the memories 272 and 273 may store in a main memory 272 information on normal control of the robot cleaner 2, and may temporarily store an auxiliary memory 273 information collected while the robot cleaner 2 is operating, respectively.

As an example, when mapping is performed at an initial operation of the robot cleaner 2, information on a mapped space may be stored in the main memory 272. In addition, information to recognize a specific module (M) mounted on the robot cleaner 2 may also be stored in the main memory 272. When an air purification module is mounted on the robot cleaner 2, information on the amount of time for performing air purification in accordance with a measured air pollution level while the robot cleaner 2 is disposed at a predetermined space may be stored in the auxiliary memory 273. Types of information stored in the main memory 272 and the auxiliary memory 273 are not limited to those mentioned above.

The robot cleaner 2 may include a sensor unit 274 capable of receiving a signal generated from the remote controller 4. The remote controller 4 may transmit an IR signal, and the sensor 23 may receive the IR signal transmitted from the remote controller 4 and transmit the received information to the control unit 270. The control unit 270 may control the operation of the robot cleaner 2 using the transmitted information.

The robot cleaner 2 may further include a position detection unit 275. The position detection unit 275 may detect information on a position of the robot cleaner 2 using IR rays or laser beams. When mapping is completed, the control unit 270 compares information detected by the position detection unit 275 with information stored in the main memory 272 to control an operation of the robot cleaner 2 in accordance with the space at which the robot cleaner 2 is positioned.

The robot cleaner 2 may include a module recognition unit 276 to recognize a module (M) mounted on the robot cleaner 2. When a module (M) performing a specific function is mounted on the module mounting unit 20, as the connection units 51a to 51c of the module (M) are connected to the ports 26a to 26h disposed at the connector 26, the module recognition unit 276 transmits detected information on the type of the module (M) to the control unit 270, such that the robot cleaner 2 performs a specific function of the detected module (M).

Hereinafter, description related to an operation of the robot cleaner 2 to perform a specific function when a module (M) performing a specific function is mounted on or inserted into the robot cleaner 2 will be given.

Figure 8:
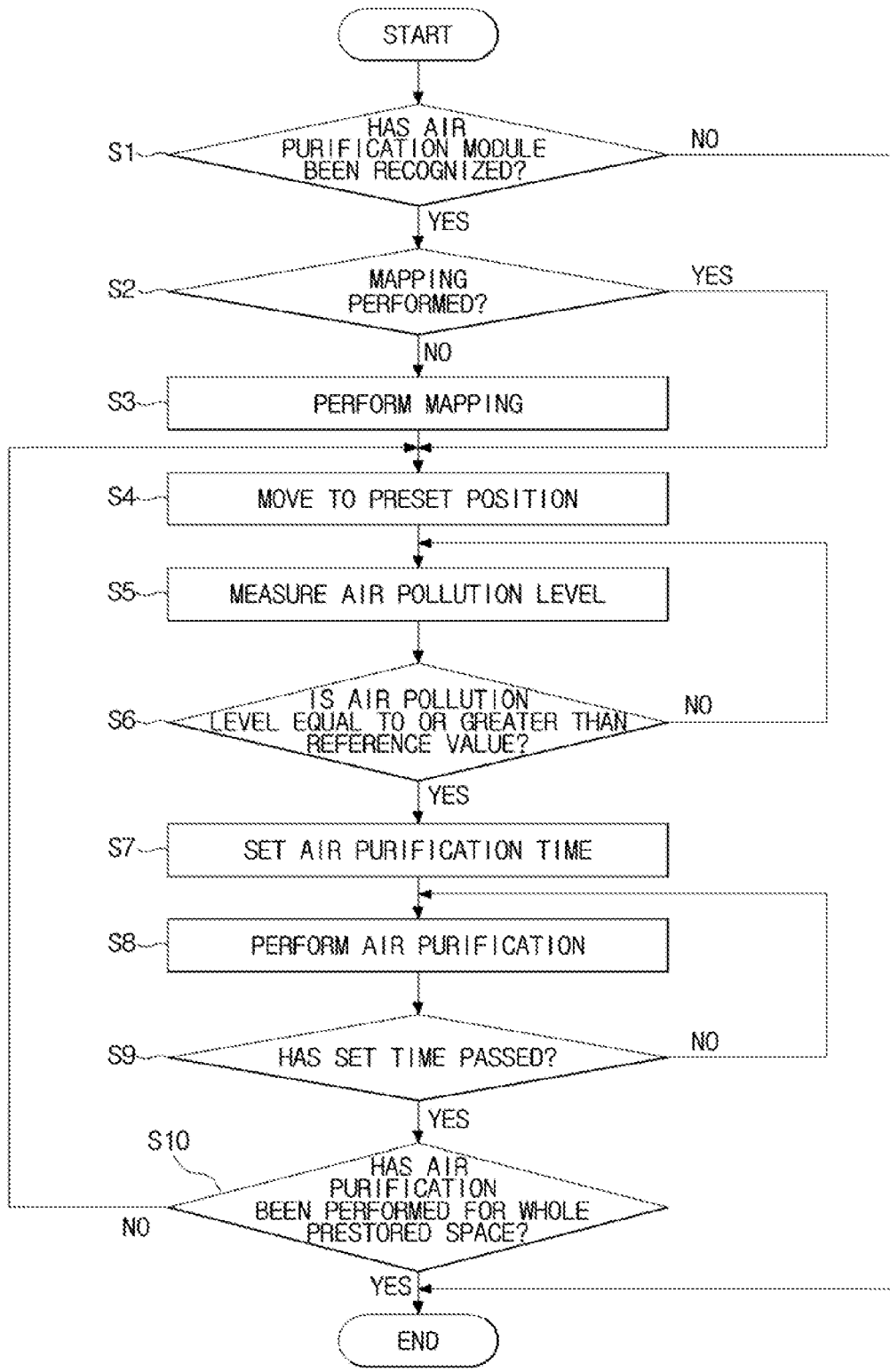
FIG. 8 is a flow chart illustrating an operation of a robot cleaner when an air purification module is mounted thereon according to an embodiment of the present disclosure.

FIG. 8 is a flow chart illustrating an operation of a robot cleaner when an air purification module is mounted thereon according to an embodiment of the present disclosure.

Referring to FIG. 8, when an air purification module (not shown) is mounted on the module mounting unit 20 of the robot cleaner 2 according to an embodiment of the present disclosure, whether the air purification module has been mounted thereon may be detected by connection of the connection units 51a to 51c disposed at the air purification module to the ports 26a to 26h of the connector 26 (S1). If it is recognized that the air purification module has been mounted thereon, whether a space to be cleaned has been mapped at an initial operation of the robot cleaner 2 may be determined (S2). If mapping of the robot cleaner 2 has not been performed yet, mapping is performed (S3). Mapping can be performed as the position detection unit 275 (of FIG. 7) collects information on a space in which the robot cleaner 2 is positioned while the robot cleaner 2 moves. As the mapping is performed, information on a space on which the robot cleaner 2 will move can be stored in the main memory 272 (of FIG. 7).

If the mapping has already been performed, the robot cleaner 2 may move to a preset position (S4). Information on a space to be air-purified when the air purification module is mounted on the robot cleaner 2 may have been stored in the main memory 272. The control unit 270 may control the robot cleaner 2 to perform an air purification function by the air purification module while moving to preset points in order in accordance with the information pre-stored in the main memory 272.

The robot cleaner 2 that has moved to the preset points may measure an air pollution level at the points (S5). A sensor that measures the air pollution level may be disposed in the robot cleaner 2 or the air purification module. The information on the measured air pollution level may be transmitted to the control unit 270 (of FIG. 7).

The control unit 270 may determine whether the measured air pollution level is equal to or greater than a reference value pre-stored in the main memory 272 (S6). If the measured air pollution level is determined to be equal to or greater than the reference value, an amount of time to perform air purification in accordance with the measured air pollution level may be determined (S7). The set air purification duration time may be stored in the auxiliary memory 273 (of FIG. 7).

The air purification module performs air purification at a space in which the robot cleaner 2 is positioned (S8). The control unit 270 can determine whether the amount of time of performing air purification at the space in which the robot cleaner 2 is positioned has reached the set air purification duration time (S9). If it is determined that the amount of time has reached the set air purification duration time, the control unit 270 determines whether the air purification has been performed at the whole space pre-stored in the main memory 272 by mapping as requiring air purification (S10). If the air purification at the whole pre-stored space has been completed, the control unit 270 may end the air purification function. When the air pollution level of the space in which the robot cleaner 2 is positioned is equal to or less than the reference value, the control unit 270 may also continue to the step (S10) of determining whether the air purification has been performed in the entire pre-stored space.

If the air purification at the whole pre-stored space has not been completed, the control unit 270 controls the robot cleaner 2 to move to the next point to be air-purified. The robot cleaner 2 that has moved to the next point measures an air pollution level, and if the air pollution level is equal to or greater than the reference value, the air purification duration time is set, and the robot cleaner 2 performs the air purification function for the set air purification duration time.

Figure 9:
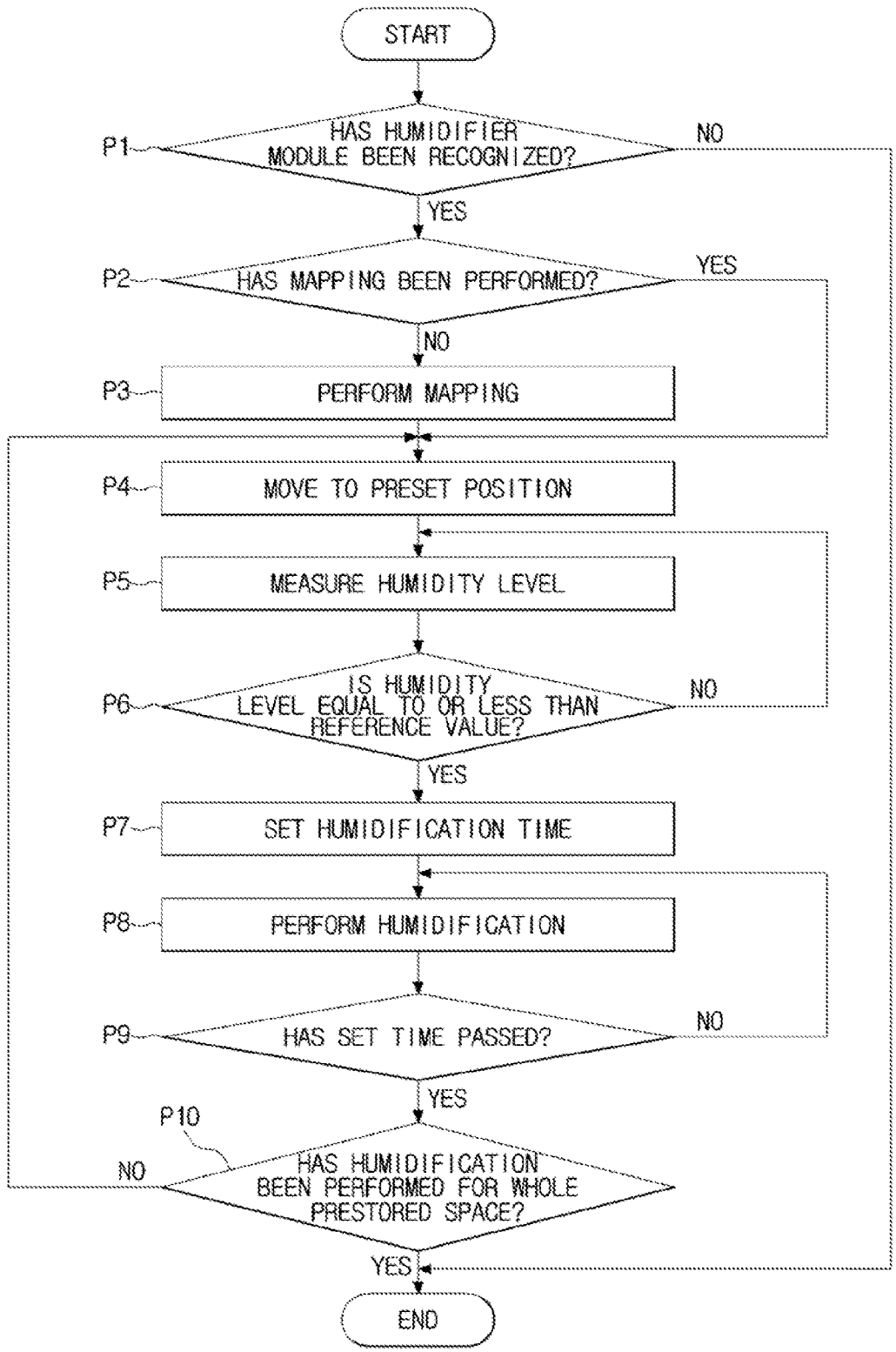
FIG. 9 is a flow chart illustrating an operation of a robot cleaner when a humidifier module is mounted thereon according to an embodiment of the present disclosure.

FIG. 9 is a flow chart illustrating an operation of a robot cleaner when a humidifier module is mounted thereon.

Referring to FIG. 9, an operation of the robot cleaner 2 when a humidifier module is mounted thereon according to an embodiment of the present disclosure may be similar with the operation of the robot cleaner 2 when the air purification module is mounted thereon. Whether a humidifier module has been mounted thereon may be detected by connection of the connection units 51*a* to 51*c* disposed at the humidifier module to the ports 26*a* to 26*h* disposed at the connector 26 (P1), and if it is recognized that the humidifier module has been mounted thereon, whether mapping has already been performed is determined (P2). If mapping has not been performed yet, mapping is performed (P3).

When mapping has already been performed, the robot cleaner 2 may move to a preset position (P4). Information on a space to be humidified when the humidifier module is mounted on the robot cleaner 2 may have been stored in the main memory 272. The control unit 270 may control the robot cleaner 2 to perform a humidification function by the humidifier module while moving to preset points in order in accordance with the information pre-stored in the main memory 272.

The robot cleaner 2 that has moved to the preset points may measure a humidity level at the points (P5). A sensor (not shown) that measures the humidity level may be disposed in the robot cleaner 2 or the humidifier module. The information on the measured humidity level may be transmitted to the control unit 270 (of FIG. 7).

The control unit 270 (of FIG. 7) may determine whether the measured humidity level is equal to or less than a reference value pre-stored in the main memory 272 (P6). If the measured humidity level is determined to be equal to or less than the reference value, the amount of time to perform humidification in accordance with the measured humidity level may be determined (P7). The set humidity duration time may be stored in the auxiliary memory 273 (of FIG. 7).

The humidifier module may perform humidification at a space in which the robot cleaner 2 is positioned (P8). The control unit 270 may determine whether the amount of time of performing the humidification function at the space in which the robot cleaner 2 is positioned has reached the set humidification duration time (P9). If it is determined that the amount of time has reached the set humidification duration time, the control unit 270 determines whether humidification has been performed at the whole space pre-stored in the main memory 272 as requiring humidification (P10). If the humidification at the whole pre-stored space has been completed, the control unit 270 may end the humidification function. When the humidity level of the space in which the robot cleaner 2 is positioned is equal to or greater than the reference value, the control unit 270 may also continue to the step (P10) of determining whether the humidification has been performed in the entire pre-stored space.

If the humidification at the whole pre-stored space has not been completed, the control unit 270 controls the robot cleaner 2 to move to the next point to be humidified. The robot cleaner 2 that has moved to the next point measures a humidity level, and if the humidity level is equal to or less than the reference value, the humidification duration time is set, and the robot cleaner 2 performs the humidification function for the set humidification duration time.

Figure 10:
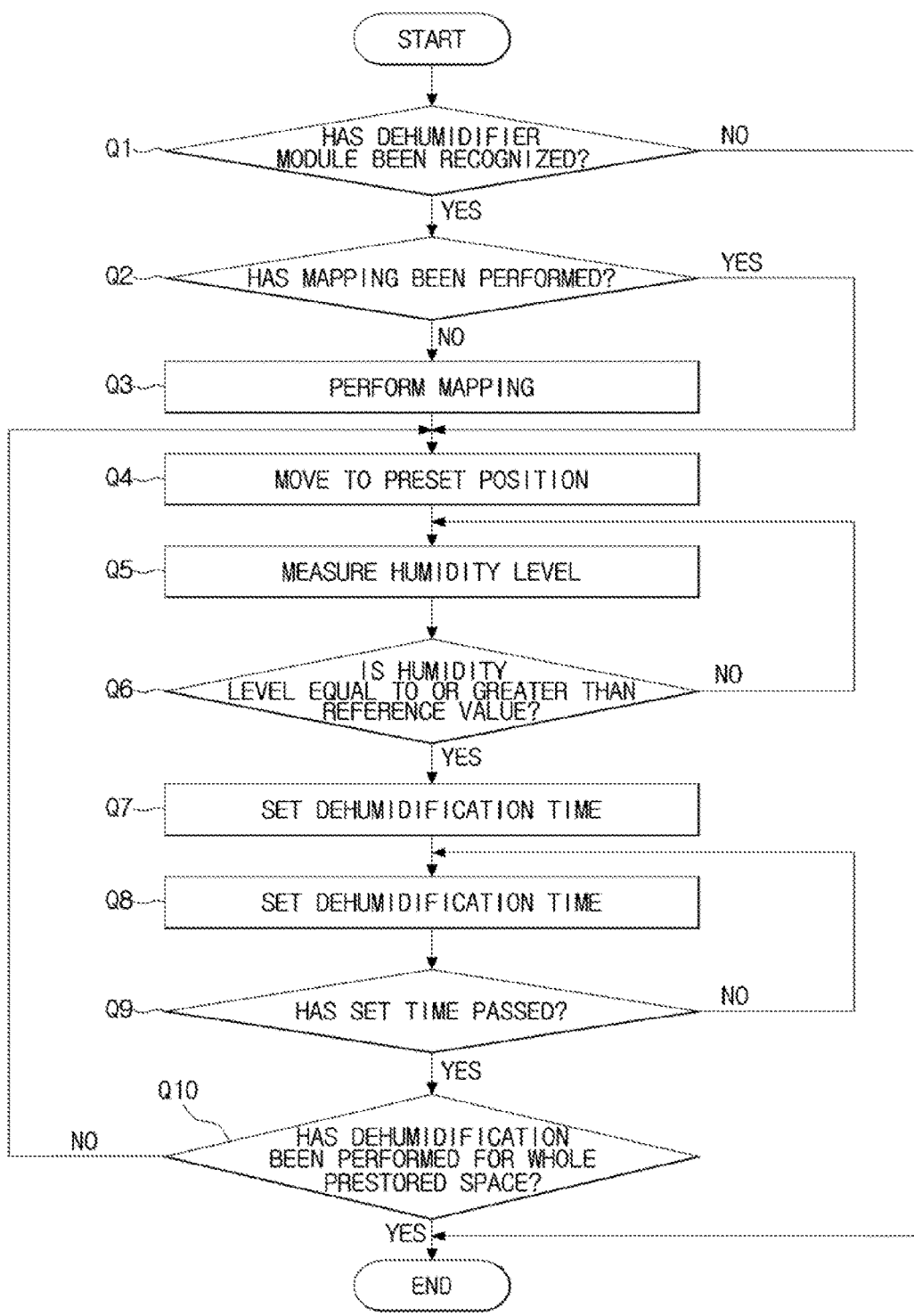
FIG. 10 is a flow chart illustrating an operation of a robot cleaner when a dehumidifier module is mounted thereon according to an embodiment of the present disclosure.

FIG. 10 is a flow chart illustrating an operation of a robot cleaner when a dehumidifier module is mounted thereon according to an embodiment of the present disclosure.

Referring to FIG. 10, an operation of the robot cleaner 2 when a dehumidifier module is mounted thereon is similar with the operation of the robot cleaner 2 when the humidifier module is mounted thereon (see Q1 to Q10). However, the operation of the robot cleaner 2 when the dehumidifier module is mounted thereon is different from the operation of the robot cleaner 2 when the humidifier module is mounted thereon in that dehumidification of a space in which the robot cleaner 2 is positioned is performed if a humidity level at the corresponding space is equal to or greater than a reference value.

The operation of the robot cleaner 2 when the air purification module, the humidifier module, or the dehumidifier module is mounted thereon is not limited to that mentioned above. As an example, the robot cleaner 2 may not perform mapping. Here, the robot cleaner 2 may perform air purification, humidification, or dehumidification for a predetermined amount of time while continuously moving, or repeat performing air purification, humidification, or dehumidification for a preset amount of time while staying at the same point and performing air purification, humidification, or dehumidification for a preset amount of time at a different position. In addition, a space to be air-purified, humidified, or dehumidified may be set via the remote controller 4.

Although it has been described above that one module performs only one function, one module may perform two or more functions. As an example, one module may perform an air purification function and a humidification function at the same time, or perform a speaker function, the air humidification function, and a lighting function at the same time.

In addition, although it has been described above that only one module (M) is mounted on the robot cleaner 2, two or more modules (M) may be mounted on the module mounting unit 20 of the robot cleaner 2. In this case, the structure of the fixing devices 24 and 25 disposed at the module mounting unit 20 may be changed to fix the two or more modules (M).

Figure 11:
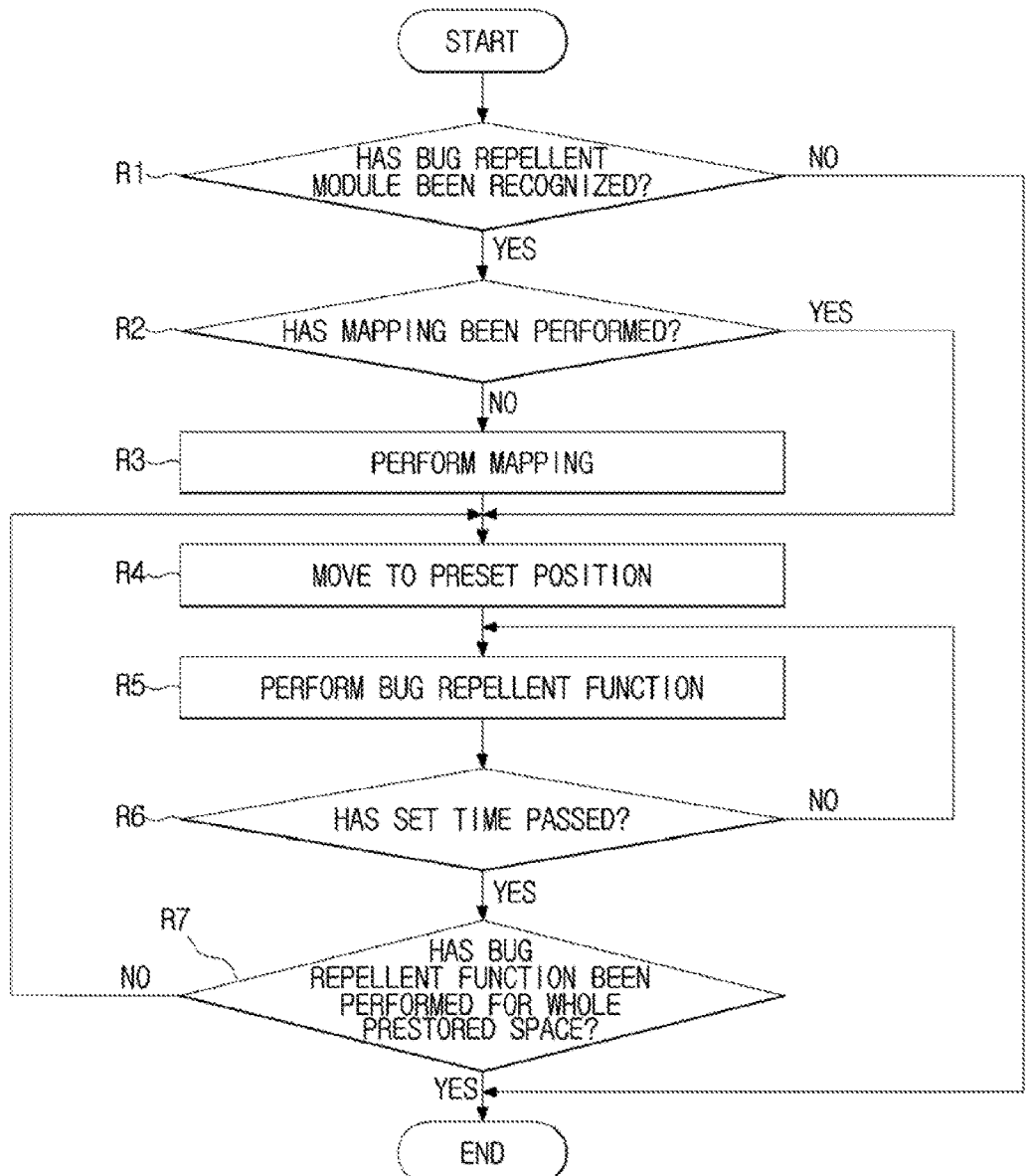
FIG. 11 is a flow chart illustrating an operation of a robot cleaner when a bug repellence module is mounted thereon according to an embodiment of the present disclosure.

FIG. 11 is a flow chart illustrating an operation of a robot cleaner when a bug repellence module is mounted thereon according to an embodiment of the present disclosure.

Referring to FIG. 11, if it is determined that a bug repellent module has been mounted on the robot cleaner 2 according to an embodiment of the present disclosure (R1), whether mapping has already been performed is determined (R2). If mapping has not been performed yet, mapping is performed (R3). If mapping has already been performed, the control unit 270 moves the robot cleaner 2 to a preset position at which bugs may be repelled (R4), and the robot cleaner 2 performs a bug repellent function (R5). The position at which bugs may be repelled may have been preset in the main memory 272. The control unit 270 determines whether the amount of time of performing the bug repellent function at the preset position has reached a preset bug repellent duration time (R6), and if the amount of time has reached the preset bug repellent duration time, the control unit 270 determines whether the bug repellent function has been performed at the whole preset space (R7). The bug repellent duration time at a specific position may have been preset in the main memory 272.

If the bug repellent function has been performed in the entire preset space, the control unit 270 ends the bug repellent function, and if the bug repellent function has not been performed in the entire preset space, the robot cleaner 2 moves to the next point from which bugs may be repelled.

When the bug repellent module is mounted on the robot cleaner 2, the bug repellent function may be performed for a selected amount of time at a selected space by the remote controller 4. If a space that requires bug repellent or the bug repellent duration time is set via the remote controller 4, the robot cleaner 2 may move to a corresponding position to perform the bug repellent function for a preset amount of time.

Figure 12:
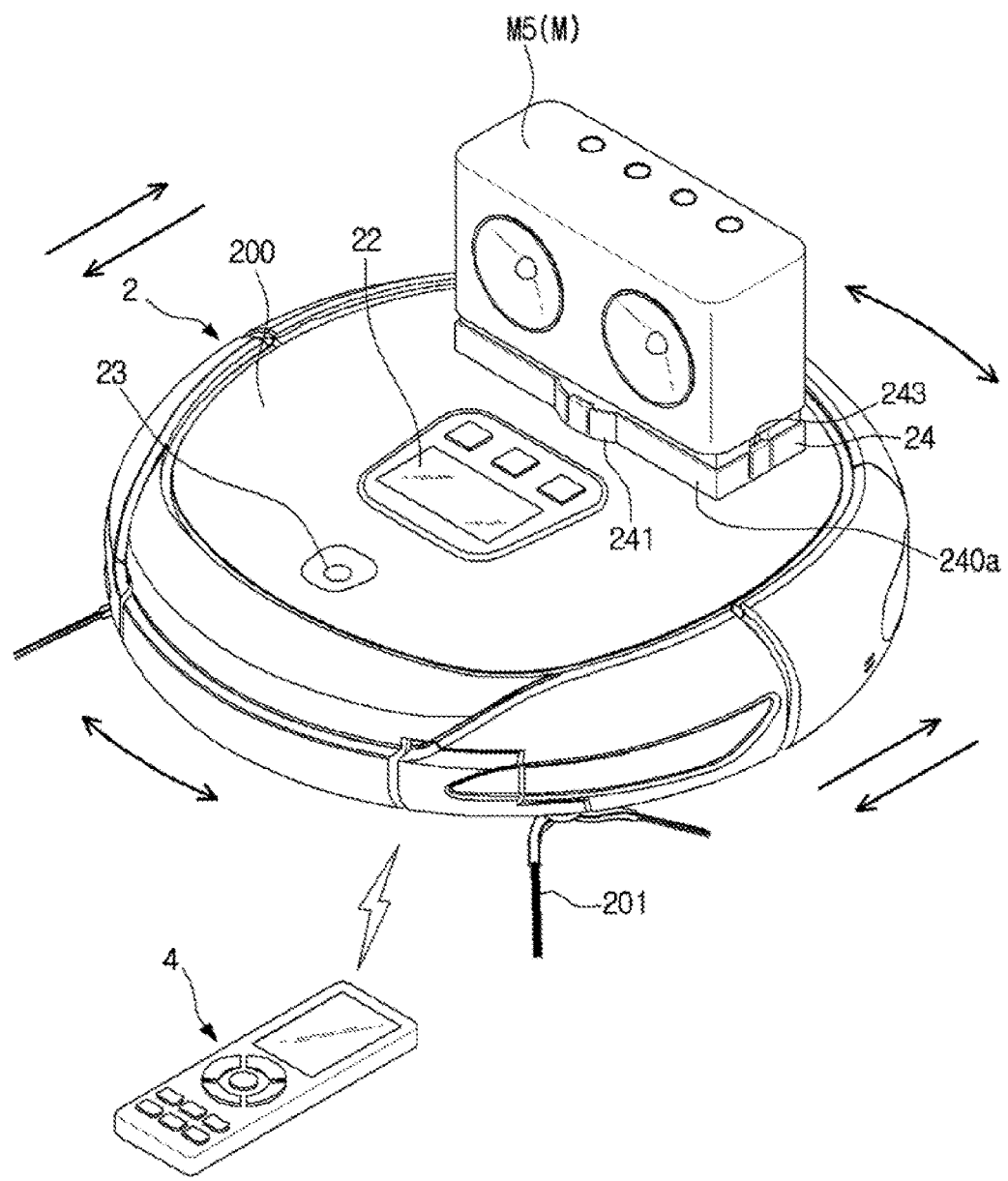
FIG. 12 is a view illustrating an appearance of a robot cleaner system when a speaker module is mounted on a robot cleaner according to an embodiment of the present disclosure.

FIG. 12 is a view illustrating an appearance of a robot cleaner system when a speaker module is mounted on a robot cleaner according to an embodiment of the present disclosure.

Referring to FIG. 12, if a speaker module (M5) is mounted on the robot cleaner 2 according to an embodiment of the present disclosure, the robot cleaner 2 may be paired to a sound system such as a mobile phone by a Bluetooth function. The Bluetooth function may be included in the robot cleaner 2 or the speaker module (M5). If the robot cleaner 2 is called by the remote controller 4, the robot cleaner 2 moves to a space in which the remote controller 4 is positioned. If a speaker function is selected by the remote controller 4, the speaker module (M5) may output a sound generated from a sound system.

The remote controller 4 may transmit information on a position of the remote controller 4 to the robot cleaner 2. The robot cleaner 2 may move to the space in which the remote controller 4 is positioned in accordance with the received information on the position of the remote controller 4. The robot cleaner 2 may perform the speaker function while following the remote controller 4 by receiving the information on the position of the remote controller 4. The robot cleaner 2 may be controlled by a radar transceiver module that detects the remote controller 4 to follow the remote controller 4, or be controlled by the Bluetooth function paired to the remote controller 4 to follow spots with a strong Bluetooth signal.

If the speaker module (M5) is mounted on the robot cleaner 2, the robot cleaner 2 may perform a dance move. As an example, the robot cleaner 2 may perform the dance move in combination of rotating to music and rapidly reciprocating a short distance in front and rear directions and in left and right directions. The dance move of the robot cleaner 2 may be performed when a specific move is selected by the remote controller 4 to be performed, or when music of a preset specific rhythm or melody is played. The robot cleaner 2 may also be used as an entertainment apparatus by the speaker function and the dance move.

Figure 13:
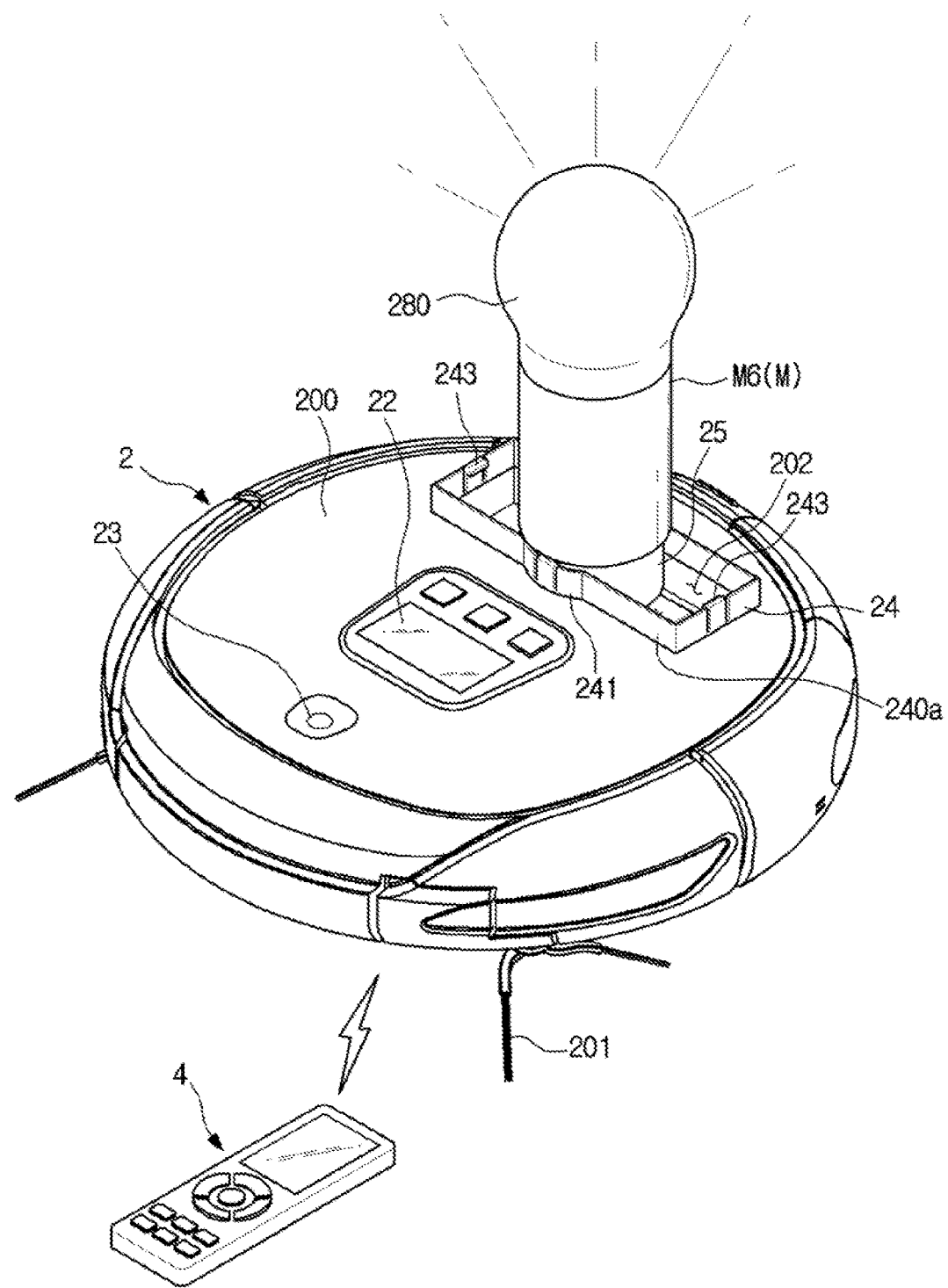
FIG. 13 is a view illustrating an appearance of a robot cleaner system when a lighting module is mounted on a robot cleaner according to an embodiment of the present disclosure.

FIG. 13 is a view illustrating an appearance of a robot cleaner system when a lighting module is mounted on a robot cleaner according to an embodiment of the present disclosure.

Referring to FIG. 13, a lighting module (M6) may be mounted on the robot cleaner 2 according to an embodiment of the present disclosure. By the remote controller 4, the robot cleaner 2 may be set to move to a space in which the remote controller 4 is positioned. If a lighting function is selected by the remote controller 4, a lighting 280 disposed at the light module (M6) may be turned on. A user may control a brightness, on/off of the power, and so on, of the lighting 280 via the remote controller 4. In addition, the remote controller 4 and the robot cleaner 2 may have a Bluetooth function or a radar transceiver to be provided such that the robot cleaner 2 can move in accordance with movement of the remote controller 4.

Figure 14:
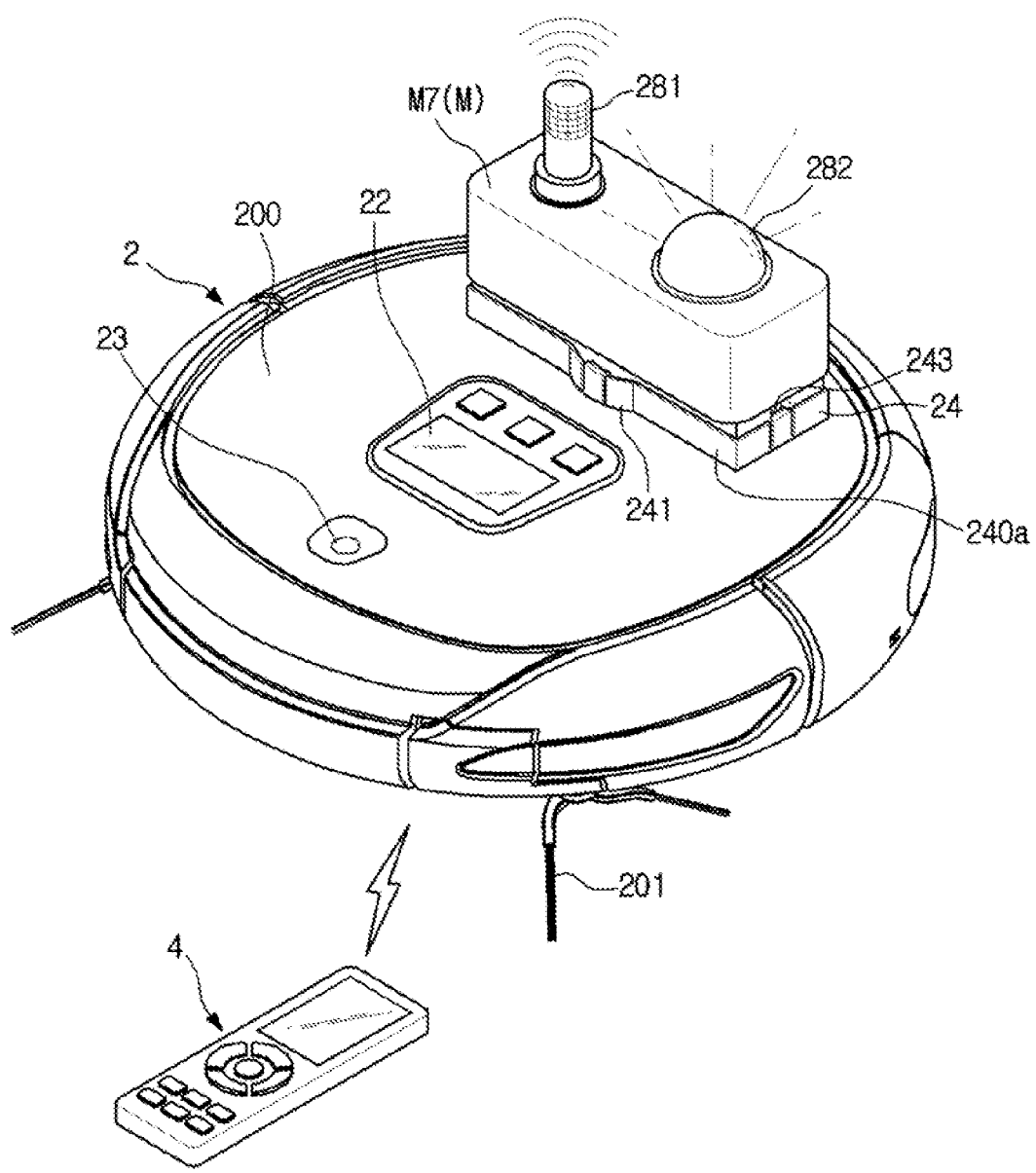
FIG. 14 is a view illustrating an appearance of a robot cleaner system when a sleep induction module is mounted on a robot cleaner according to an embodiment of the present disclosure.

FIG. 14 is a view illustrating an appearance of a robot cleaner system when a sleep induction module is mounted on a robot cleaner according to an embodiment of the present disclosure.

Referring to FIG. 14, a sleep induction module (M7) can be mounted on the robot cleaner 2 according to an embodiment of the present disclosure. The sleep induction module (M7) may include a wavelength generator 281 configured to generate a specific wavelength, and a sleep induction lamp 282.

Similar with the case in which the lighting module (M6) is mounted on the robot cleaner 2, the robot cleaner 2 may be set to move to the space in which the remote controller 4 is positioned by the remote controller 4. If a sleep induction function is selected by the remote controller 4, the wavelength generator 281 may generate a wavelength to induce sleep and the sleep induction lamp 282 may be turned on. The user may control a strength of the wavelength, and the brightness and on/off of the power, and so on, of the sleep induction lamp 282 by the remote controller 4.

The types of modules (M) capable of being mounted on the robot cleaner 2 are not limited to those mentioned above. Modules (M) with various functions may be mounted on the robot cleaner 2 to perform the various functions.

According to an embodiment of the present disclosure, modules with various functions can be mounted on a robot cleaner, such that the robot cleaner can perform various additional functions other than cleaning while moving. A connector is included in the robot cleaner, such that, when at least one module performing a specific function is mounted on the robot cleaner, control related to the at least one module can be performed.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A robot cleaner configured to clean a floor surface while moving on the floor surface, the robot cleaner comprising:
   a module mounting unit on which at least one module capable of performing a function other than cleaning is able to be mounted, and
   a plurality of ports,
   wherein:
   at the module mounting unit, an opening is formed and provided at one side of a housing that forms an exterior of the robot cleaner,
   at the module mounting unit, fixing devices configured to fix the at least one module inserted into the module mounting unit are disposed, and the fixing devices comprise:
   a first fixing device including a rectangular frame; and
   a second fixing device including a circular frame,
   a connection unit connected to at least one of the plurality of ports is disposed at the at least one module, and
   a function of the at least one module is recognized in accordance with at least one of positions and a number of the positions at which the connection unit is connected to the at least one of the plurality of ports.

2. The robot cleaner according to claim 1, wherein the module is at least one of an air purification module, a humidifier module, a dehumidifier module, a bug repellence module, a speaker module, a lighting module, and a sleep induction module.

3. The robot cleaner according to claim 1, wherein, if the at least one module is mounted on the module mounting unit, a control unit recognizes the at least one module and controls the at least one module to perform the function.

4. The robot cleaner according to claim 1, wherein the at least one of the plurality of ports is a power port configured to provide a driving force to the module.

5. The robot cleaner according to claim 1, wherein the fixing devices comprise frames formed to correspond to a shape of the opening.

6. The robot cleaner according to claim 5, wherein:
at least one fixing unit is provided at the frames; and
the at least one module is fixed by the at least one fixing unit when the at least one module is inserted into inner portions of the frames.

7. The robot cleaner according to claim 6, wherein the at least one fixing unit fixes the at least one module via hooking.

8. The robot cleaner according to claim 1, wherein the second fixing device is able to be inserted into the first fixing device and fixed.

9. The robot cleaner according to claim 8, wherein:
at least one fixing unit is provided at the first fixing device; and
an interference unit capable of interfering with the at least one fixing unit is provided at the second fixing device.

10. The robot cleaner according to claim 1, wherein:
a rectangular parallelepiped module is inserted into the first fixing device and fixed; and
a cylindrical module is inserted into the second fixing device and fixed.

11. A robot cleaner system comprising:
a robot cleaner configured to clean a floor surface while moving on the floor surface, and having:
a module mounting unit on which at least one module capable of performing a function other than cleaning is able to be mounted, and
a plurality of ports; and
a remote controller provided to remotely control the robot cleaner,
wherein:
at the module mounting unit, an opening is formed and provided at one side of a housing that forms an exterior of the robot cleaner,
at the module mounting unit, fixing devices configured to fix the at least one module inserted into the module mounting unit are disposed, and the fixing devices comprise:
a first fixing device including a rectangular frame; and
a second fixing device including a circular frame,
a connection unit connected to at least one of the plurality of ports is disposed at the at least one module, and
a function of the at least one module is recognized in accordance with at least one of positions and a number of the positions at which the connection unit is connected to the at least one of the plurality of ports.

12. The robot cleaner system according to claim 11, wherein:
the remote controller transmits a signal related to a position of the remote controller; and
the robot cleaner receives the signal, such that the robot cleaner moves in accordance with the signal generated from the remote controller.

13. The robot cleaner system according to claim 12, wherein the robot cleaner is Bluetooth-paired to the remote controller.

14. The robot cleaner system according to claim 12, wherein the robot cleaner moves in accordance with the remote controller by a radar transceiver module.

15. The robot cleaner system according to claim 11, wherein the at least one module is at least one of an air purification module, a humidifier module, a dehumidifier module, a bug repellence module, a speaker module, a lighting module, and a sleep induction module.

16. The robot cleaner system according to claim 11, wherein, when the at least one module is mounted on the module mounting unit, the connection unit disposed at the at least one module is connected to at least one of the plurality of ports provided at the module mounting unit, a driving force is transmitted to the at least one module, and a function of the at least one module is executed.

17. The robot cleaner system according to claim 11, wherein, when a speaker module is mounted on the robot cleaner, the robot cleaner performs a preset dance move.

18. The robot cleaner system according to claim 17, wherein the preset dance move is formed of a combination of rotating and rapidly reciprocating in front and rear directions and in left and right directions.

19. The robot cleaner system according to claim 11, wherein:
the first fixing device is capable of fixing a rectangular parallelepiped module; and
the second fixing device is capable of fixing a cylindrical module.

20. The robot cleaner system according to claim 19, wherein the second fixing device is detachably disposed at the first fixing device.

21. A robot cleaner system comprising:
a robot cleaner configured to clean a floor surface while moving on the floor surface, and having a module mounting unit on which at least one module capable of performing a function other than cleaning is able to be mounted; and
a remote controller provided to remotely control the robot cleaner,
wherein:
at the module mounting unit, an opening is formed and provided at one side of a housing that forms an exterior of the robot cleaner,
at the module mounting unit, fixing devices configured to fix the at least one module inserted into the module mounting unit are disposed, and the fixing devices comprise:
a first fixing device including a rectangular frame; and
a second fixing device including a circular frame,
a plurality of ports are provided at the module mounting unit and a connection unit connected to at least one of the plurality of ports is disposed at the at least one module mounted on the module mounting unit, such that, when the connection unit is connected to the at least one of the plurality of ports, the at least one module is recognized and a driving force is supplied to the at least one module to execute a function of the at least one module, and the function of the at least one module is recognized in accordance with at least one of positions and a number of the positions at which the connection unit is connected to the at least one of the plurality of ports.

22. The robot cleaner system according to claim 21, wherein a movement of the robot cleaner and the function of the at least one module are controlled by the remote controller.

23. The robot cleaner according to claim 1, wherein when the robot cleaner performs the cleaning function without mounting the at least one module on the module mounting unit, the module mounting unit is configured to be covered by a module cover.

24. The robot cleaner system according to claim 11, wherein when the robot cleaner performs the cleaning function without mounting the at least one module on the module mounting unit, the module mounting unit is configured to be covered by a module cover.

25. The robot cleaner system according to claim 21, wherein when the robot cleaner performs the cleaning function without mounting the at least one module on the module mounting unit, the module mounting unit is configured to be covered by a module cover.

26. The robot cleaner system according to claim 24, wherein:

the opening is covered by the module cover when the at least one module is not mounted on the module mounting unit; and the module cover is removable to expose the opening.

* * * * *